(12) United States Patent
Saito et al.

(10) Patent No.: US 7,592,641 B2
(45) Date of Patent: Sep. 22, 2009

(54) SEMICONDUCTOR DEVICE, METHOD FOR FABRICATING AN ELECTRODE, AND METHOD FOR MANUFACTURING A SEMICONDUCTOR DEVICE

(75) Inventors: Shinji Saito, Yokohama (JP); Shinya Nunoue, Ichikawa (JP); Toshiyuki Oka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 473 days.

(21) Appl. No.: 10/574,850

(22) PCT Filed: Feb. 21, 2006

(86) PCT No.: PCT/JP2006/003523

§ 371 (c)(1),
(2), (4) Date: Apr. 6, 2006

(87) PCT Pub. No.: WO2006/134689

PCT Pub. Date: Dec. 21, 2006

(65) Prior Publication Data

US 2008/0246049 A1    Oct. 9, 2008

(30) Foreign Application Priority Data

Jun. 13, 2005    (JP)    .............................. 2005-172585

(51) Int. Cl.
*H01L 29/24* (2006.01)
(52) U.S. Cl. ...................... 257/103; 257/189; 257/744; 257/745; 257/E21.172; 257/E29.143; 257/E29.144

(58) Field of Classification Search ................. 257/103, 257/189, 744, 745, E21.172, E29.143, E29.144
See application file for complete search history.

(56) References Cited

U.S. PATENT DOCUMENTS

| 6,239,490 | B1 * | 5/2001 | Yamada et al. ............... 257/745 |
| 6,586,328 | B1 | 7/2003 | Adesida et al. |
| 7,009,218 | B2 | 3/2006 | Sugimoto et al. |
| 7,323,724 | B2 | 1/2008 | Sugimoto et al. |
| 2002/0036286 | A1 * | 3/2002 | Ho et al. ........................ 257/11 |
| 2007/0029568 | A1 | 2/2007 | Choo et al. |

FOREIGN PATENT DOCUMENTS

| CN | 1523684 | 8/2004 |
| EP | 1 033 355 | 9/2000 |
| EP | 1 450 414 | 8/2004 |
| JP | 7-153700 | 6/1995 |
| JP | 2001-85736 | 3/2001 |
| JP | 3230463 | 9/2001 |
| JP | 3233258 | 9/2001 |
| KR | 10-2005-0020339 | 3/2005 |
| TW | 514622 | 12/2002 |
| TW | 567516 | 12/2003 |
| WO | 2004 047189 | 6/2004 |
| WO | 2006 014996 | 2/2006 |

* cited by examiner

*Primary Examiner*—Andy Huynh
(74) *Attorney, Agent, or Firm*—Oblon, Spivak, McClelland, Maier & Neustadt, L.L.P.

(57)    ABSTRACT

A semiconductor device includes a p-type nitride semiconductor layer (14); and a p-side electrode (18) including a palladium oxide film (30) connected to a surface of the nitride semiconductor layer (14).

6 Claims, 8 Drawing Sheets

SEMICONDUCTOR DEVICE, METHOD FOR FABRICATING AN ELECTRODE, AND METHOD FOR MANUFACTURING A SEMICONDUCTOR DEVICE

TECHNICAL FIELD

The present invention relates to a nitride based semiconductor device, a method for fabricating an electrode of a p-type nitride semiconductor layer, and a method for manufacturing the nitride based semiconductor device.

BACKGROUND ART

Since a semiconductor light-emitting element has a small size and a long lifetime, existing light-emitting devices are in the process of being replaced by semiconductor light-emitting elements. For example, semiconductor laser diodes (LDs), which use a stimulated emission, are being used in display devices, storage devices such as optical disk devices, and the like. Semiconductor light-emitting diodes (LEDs), which use a spontaneous emission, are being used in display devices and the like because of increased brightness.

Recently, LEDs have been used for lighting. Since the LEDs are more efficient and generate less heat than incandescent lamps, it is considered that replacement of the incandescent lamps by the LEDs will continue to progress in the future. A LED potentially has a capability to increase the efficiency of converting electricity to light close to 100%. However, the LED has a problem for a decrease of an operating voltage. Moreover, in the replacement of the fluorescent lamps, there is a problem in efficiency, heat generation, and operating power source.

A nitride semiconductor is a strong crystal and therefore can work with a large current and a high voltage. For a semiconductor device other than a LED also, the nitride semiconductor may provide characteristics which exceed the performance of a semiconductor, such as gallium arsenide (GaAs), and silicon (Si). However, in a nitride semiconductor, it is difficult to provide an electrode having a low contact resistance, particularly to a p-type semiconductor layer.

With respect to nitride semiconductor light-emitting elements, there is a proposal to use a metal at least containing palladium (Pd) (refer to Japanese Patent No. 3233258) in order to provide an electrode to a p-type layer (hereinafter referred to as p-side electrode) with a low contact resistance. Additionally, technology has been disclosed where an oxide of nickel (Ni) and a palladium (Pd) metal are used (refer to Japanese Patent No. 3230463). However, in each of the above technologies, an operating voltage of a nitride semiconductor light-emitting element is high, and contact resistance is not sufficiently reduced.

If a contact resistance of an electrode to supply power to a semiconductor layer is high, a high operation voltage occurs and causes a problem for improving operating efficiency of a semiconductor device. Additionally, by heat generation at an interface between the semiconductor layer and the electrode, due to high contact resistance, the electrode is damaged as is the semiconductor layer in the vicinity of the electrode, which leads to degradation in reliability of the semiconductor device. Furthermore, a pad electrode, such as gold (Au), is provided on the electrode of the semiconductor device for wiring, such as wire bonding. Au can be diffused into the semiconductor layer through grain boundaries of the electrode metal. The diffused Au causes leakage of the semiconductor device and creates a reliability problem for the semiconductor device.

DISCLOSURE OF INVENTION

It is an object of the present invention to provide a semiconductor device in which a low operating voltage can be achieved and reliability may be improved.

A first aspect of the present invention inheres in a semiconductor device including a p-type nitride semiconductor layer; and a p-side electrode including a palladium oxide film connected to a surface of the nitride semiconductor layer.

A second aspect of the present invention inheres in a method for fabricating an electrode including depositing a palladium film on a p-type semiconductor layer; and forming a palladium oxide layer by annealing the semiconductor layer in an oxygen ambience so as to oxidize the palladium film adjacent to the semiconductor layer.

A third aspect of the present invention inheres in a method for manufacturing a semiconductor device including growing an epitaxial growth layer including a light-emitting layer on a substrate, and a p-type contact layer on the epitaxial growth layer; depositing a palladium film on the contact layer; and forming a palladium oxide layer by annealing the substrate in an oxygen ambience so as to oxidize the palladium film adjacent to the contact layer.

BEST MODE FOR CARRYING OUT THE INVENTION

Figure 1:
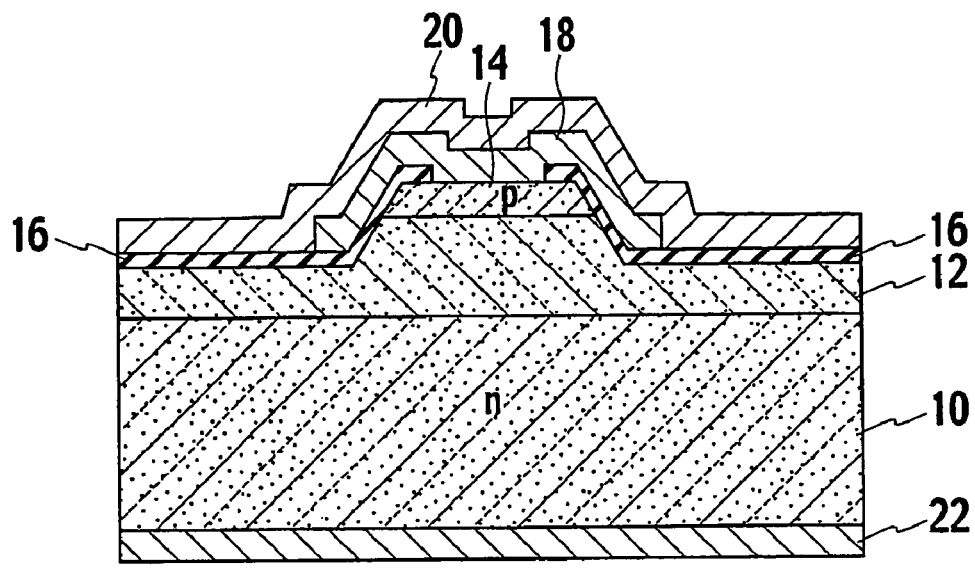
FIG. 1 is a cross sectional view showing an example of a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, a blue LD, as a semiconductor device according to a first embodiment of the present invention, includes an epitaxial growth layer 12, a contact layer (p-type semiconductor layer) 14 and the like, on a substrate 10. The contact layer 14 and a part of the epitaxial growth layer 12 provide a mesa-shape ridge. A nitride semiconductor substrate such as gallium nitride (GaN), is used as the substrate 10. The epitaxial growth layer 12 includes an n-type GaN layer, an n-type aluminum gallium nitride (AlGaN) clad layer, an n-type GaN guide layer, an indium gallium nitride (InGaN) multi-quantum well (MQW) layer, a p-type GaN guide layer, a p-type AlGaN clad layer, and the like. A p-type semiconductor layer, such as GaN, is used as the contact layer 14. Note that a light-emitting layer of the LD is the MQW layer in the epitaxial growth layer 12.

An insulating film 16 is provided on a side surface of the ridge including an edge portion of the contact layer 14 and a front surface of the epitaxial growth layer 12. A p-side electrode 18 is provided on a part of the insulating film 16 and a part of a front surface of the contact layer 14 in an opening portion of the insulating film 16. A pad electrode 20 is provided on front surfaces of the p-side electrode 18 and the insulating film 16. Additionally, an n-side electrode 22 is provided on a back surface of the substrate 10.

Figure 2:
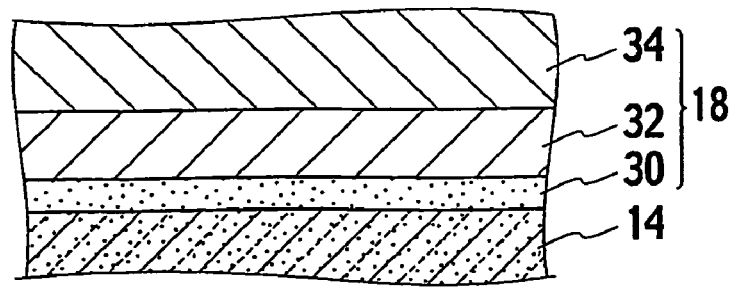
FIG. 2 is a cross sectional view showing an example of a p-side electrode according to the first embodiment of the present invention.

As shown in FIG. 2, the p-side electrode 18 according to the first embodiment of the present invention includes a palladium oxide (PdO) film 30 connected to the front surface of the contact layer 14, a Pd film 32 on the PdO film 30, and a platinum (Pt) film 34 on the Pd film 32. A metal such as Au, which has a low resistivity and on which wire bonding can be easily performed is used for the pad electrode 20. A laminated metal film, such as titan (Ti)/Pt/Au, is used for the n-side electrode 22.

In the first embodiment of the present invention, the p-side electrode 18 includes the Pt film 34 on the Pd film 32. The Pt works as a diffusion barrier film against a metal material such as Au. Therefore, it is possible to prevent the Au diffusion from the pad electrode 20, and to improve a reliability of the LD.

In the first embodiment of the present invention, the PdO film 30 is formed by depositing and annealing the Pd film 32 and the Pt film 34 on the contact layer 14. For example, a Pd metal is deposited on a front surface of the semiconductor layer, such as GaN, and annealed at a low pressure, for example, about 10 Pa in an oxygen ($O_2$) ambience, and at a temperature less than 400° C., for example about 390° C., for about 100 min. Afterward, by Auger electron spectroscopy (AES) in combination with sputtering, a distribution of elements as a function of depth in a Pd/PdO/GaN structure was measured.

Figure 3:
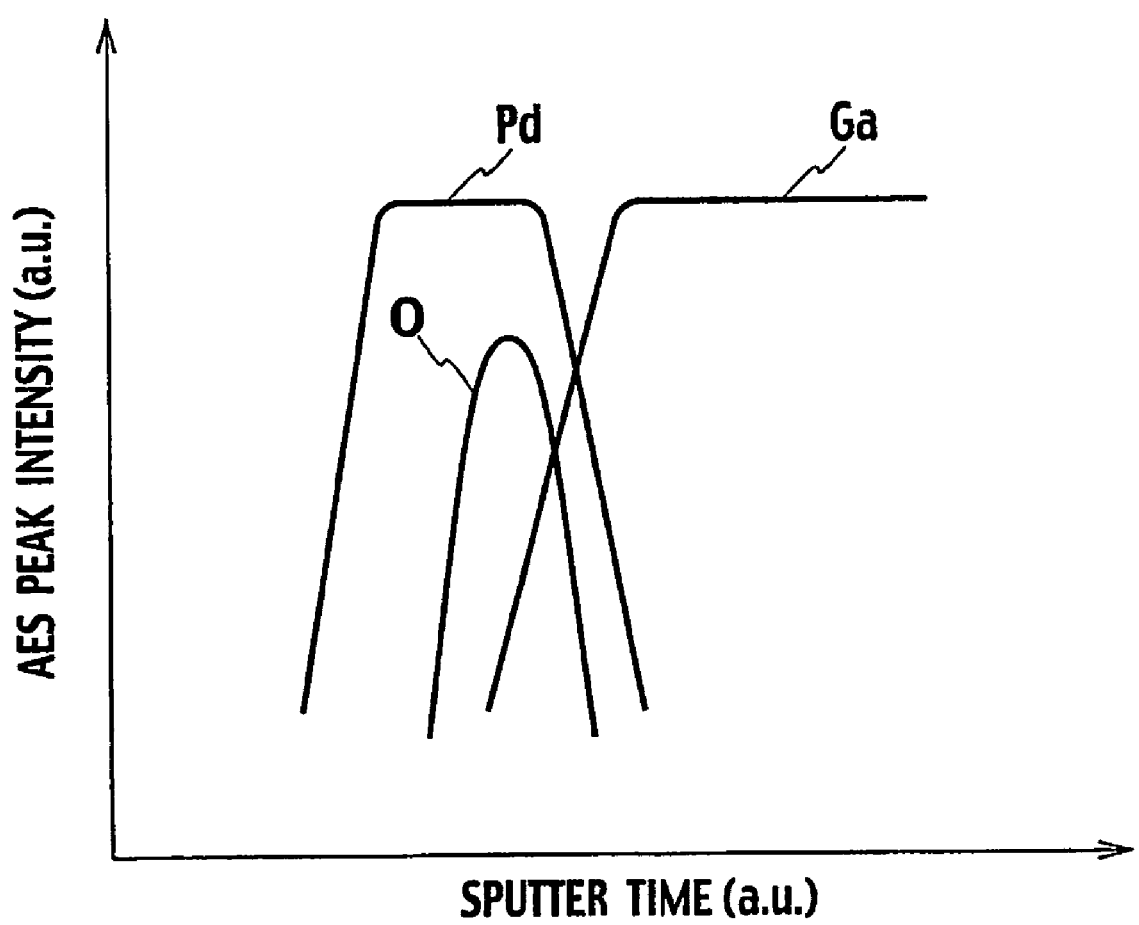
FIG. 3 is a view showing an example of a measurement result of AES of a p-side electrode according to the first embodiment of the present invention.

As shown in FIG. 3, variations of AES peak intensities of Pd, O and Ga in an Auger electron spectrum, respectively, in relation to sputtering time were evaluated. An AES peak of O is in a Pd film in the vicinity of an interface between a GaN semiconductor layer and the Pd film. As a result, it can be understood that $O_2$ remaining in the interface between the GaN semiconductor layer and the Pd film reacts with Pd.

Figure 4:
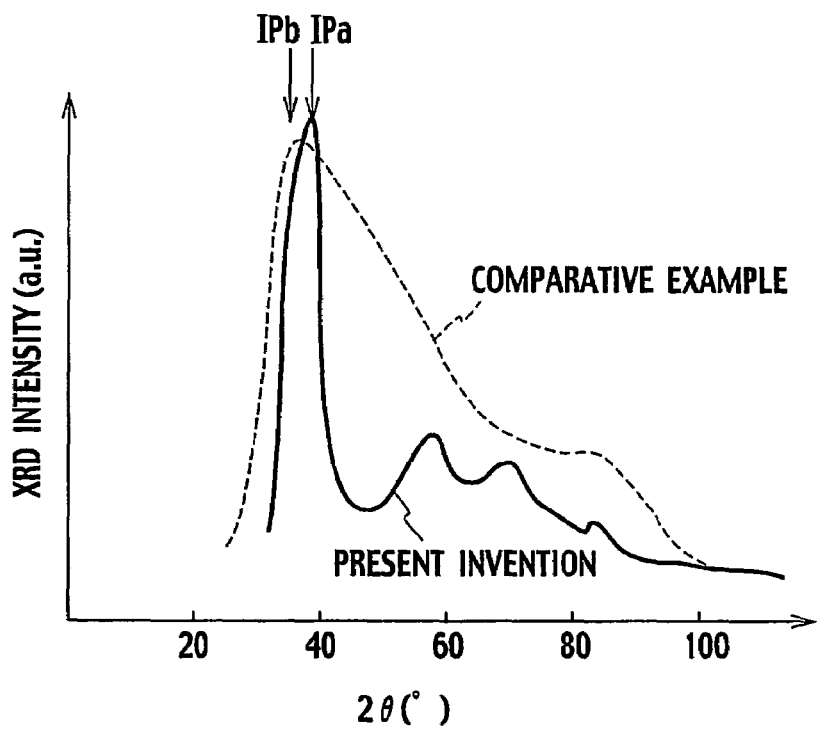
FIG. 4 is a view showing an example of a measurement result of XRD of a p-side electrode according to the first embodiment of the present invention.

Additionally, a crystal lattice structure of the PdO film formed by annealing was measured by X-ray diffraction (XRD). As shown in FIG. 4, a main peak IPa of an XRD intensity spectrum is adjacent to a diffraction angle 2θ corresponding to a crystal lattice structure of the PdO film having a platinum sulfide (PtS) structure. As a comparative example, an XRD intensity spectrum of a PdO film annealed at a temperature not less than 400° C. is also shown in FIG. 4. Note that annealing for the comparative example was conducted with the same conditions as those for the first embodiment of the present invention, except for the heat treatment temperature. A diffraction angle 2θ corresponding to a main peak IPb of the comparative example is in a smaller angle side than the peak IPa. Furthermore, a half maximum full-width of the peak IPb is wider than the peak IPa.

As a crystal lattice structure of a PdO crystal other than the PtS structure, a cobalt oxide (CoO) structure is known. A diffraction angle 2θ of a CoO structure type PdO crystal is in a smaller angle side than the PtS structure type PdO crystal. In the comparative example, it is understood that a content of the CoO structure type PdO crystal mixed in the PtS structure type PdO crystal is increased in the comparative example. From current-voltage characteristics measured for Pd/PdO films on p-type GaN semiconductor layers, it is known that contact resistance may be increased by increasing the content of the CoO structure type PdO crystal. For example, X-ray scattering intensities have been calculated based on crystal lattice structures of the respective PtS and CoO structure type PdO crystals, to implement fitting with respect to a measured XRD intensity spectrum. As a result, it has been determined that, in a case where a percentage content of the PtS structure type PdO crystal in the PdO film is not less than about 50%, a useful and favorable electric characteristic without a rectifying property can be obtained.

Figure 5:
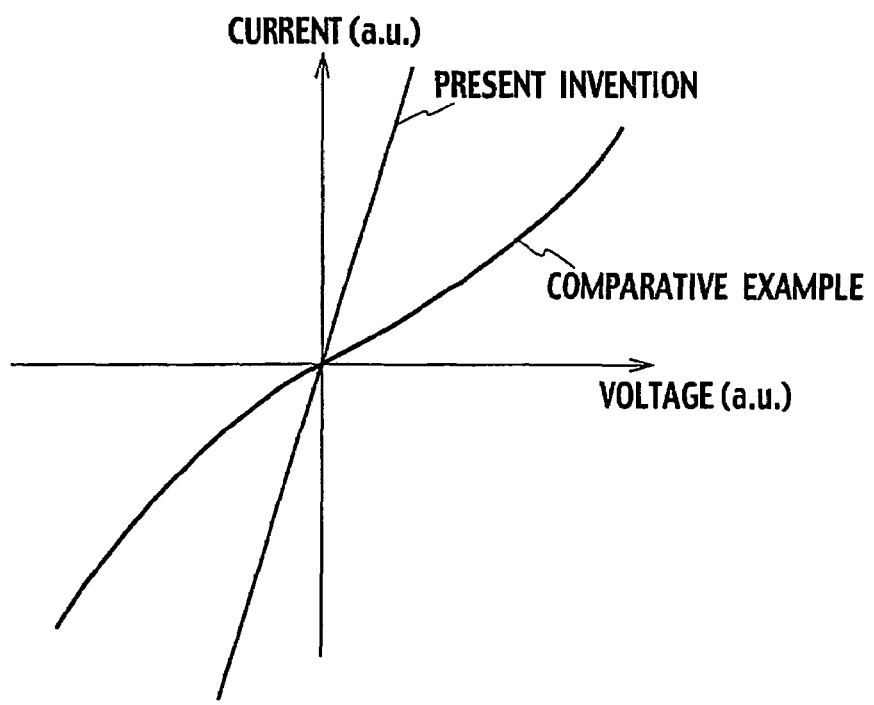
FIG. 5 is a view showing an example of a current-voltage characteristic of a semiconductor device according to the first embodiment of the present invention.

In the LD according to the first embodiment of the present invention, as shown in FIG. 5, it can be understood that a current-voltage characteristic between the p-side electrode 18 and the n-side electrode 22 does not have a rectifying property, so that a carrier may be injected at a low voltage. A thickness of the PdO film 30 shown in FIG. 2 is as small as 10 nm or less, for example. Furthermore, the PdO crystal serves as a semiconductor to reduce a potential barrier generated between the p-type GaN semiconductor layer and the Pd film 32. Therefore, it is possible to inject carriers over the potential barrier between the p-type GaN semiconductor layer and the Pd film 32 by field emission or thermionic emission.

In another comparative example having the same structure as the LD shown in FIG. 1, with a p-side electrode using a Pd film which has not been annealed, a rectifying property is observed in the current-voltage characteristic as shown in FIG. 5. A potential barrier height between the p-type GaN semiconductor layer and the Pd film is about 1.5 eV. Thus, in a low electric field, the potential barrier height cannot be lowered enough to inject carriers over the potential barrier by thermionic emission.

In order to generate the PtS structure type PdO crystal, it is efficient to anneal the PdO film in an $O_2$ ambience and at a low pressure. When annealing at a low pressure, the pressure is regulated to introduce an $O_2$ gas and evacuating by using a vacuum pump. For example, in a case of annealing the p-side electrode 18 at an atmospheric pressure, it takes a long time to sufficiently oxidize the Pd film. Moreover, in a case of annealing in a nitrogen ($N_2$) ambience, oxidization of the Pd film may not progress. Furthermore, in a case of annealing in air at a reduced pressure, an effect similar to the $O_2$ ambience may be obtained. However, uniformity of the oxidization of the Pd film is deteriorated and a yield thereof is decreased because moisture contained in the air nonuniformly adheres to a front surface of the p-side electrode so as to nonuniformly oxidize the PdO film.

In a fabrication method for a p-side electrode according to the first embodiment of the present invention, it is desirable to anneal a Pd film in a temperature range from about 200° C. to about 400° C. If the annealing temperature is less than about 200° C., oxidization hardly progresses. Moreover, if the annealing temperature is about 400° C. or more, as described above, the CoO structure type PdO crystal is generated to increase contact resistance. Note that, in the PdO film including the CoO structure type PdO crystal, although contact resistance is increased, a rectifying property is not observed. Furthermore, with a high temperature of about 750° C. to about 800° C., the PdO film may become an insulator and become inadequate as an electrode.

Additionally, after annealing, it is effective to decrease the temperature at a slow rate. Specifically, by decreasing the temperature by about 0.1° C./s from the annealing temperature to about 200° C., the operating voltage of the LD may be effectively decreased.

A manufacturing method of a semiconductor device according to the first embodiment of the present invention will be described using cross sectional views shown in FIGS. 6 to 10.

Figure 6:
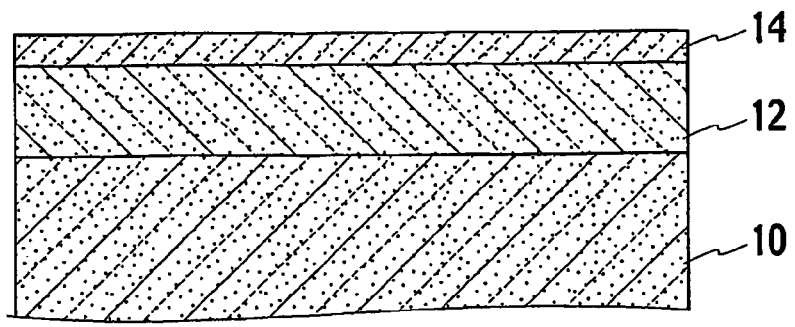
FIGS. 6 to 10 are cross sectional views showing an example of a method for manufacturing a semiconductor device according to the first embodiment of the present invention.

After pretreatment of the substrate 10, such as n-type GaN, by an organic solvent and an acid, the substrate 10 is loaded in a growth chamber of a metal-organic chemical vapor deposition (MOCVD) apparatus. As shown in FIG. 6, the epitaxial growth layer 12 and the p-type GaN contact layer 14 are grown on the substrate 10 by MOCVD. As the epitaxial growth layer 12, a Si-doped n-type GaN layer, a Si-doped n-type aluminum gallium nitride (AlGaN) clad layer, an n-type GaN guide layer, an indium gallium nitride (InGaN) multi-quantum well layer, a p-type GaN guide layer, and a Mg-doped p-type AlGaN clad layer are sequentially grown.

Figure 7:
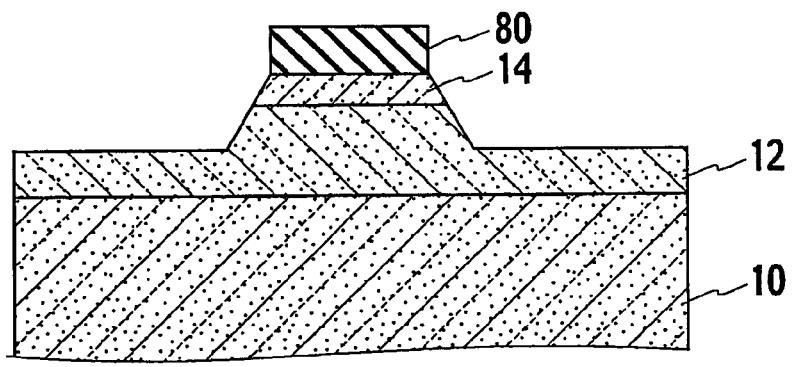

As shown in FIG. 7, a resist film 80 is formed by photolithography and the like. By dry etching such as reactive ion etching (RIE), and the like, the contact layer 14 and the epitaxial growth layer 12 are selectively removed by using the resist film 80 as a mask, to form a ridge structure. The resist film 80 is removed by a resist remover.

Figure 8:
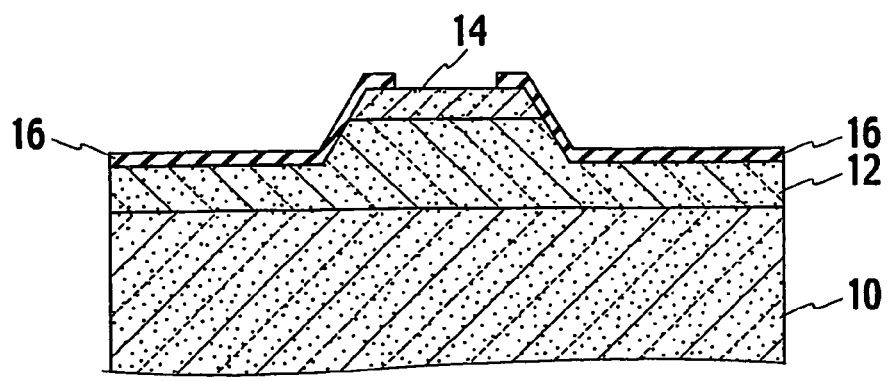

As shown in FIG. 8, an insulating film 16, such as silicon oxide ($SiO_2$) and silicon nitride ($Si_3N_4$), is deposited on front surfaces of the epitaxial growth layer 12 and the contact layer 14 by chemical vapor deposition (CVD) and the like. An opening is formed in the insulating film 16 in order to expose the front surface of the contact layer 14.

Figure 9:
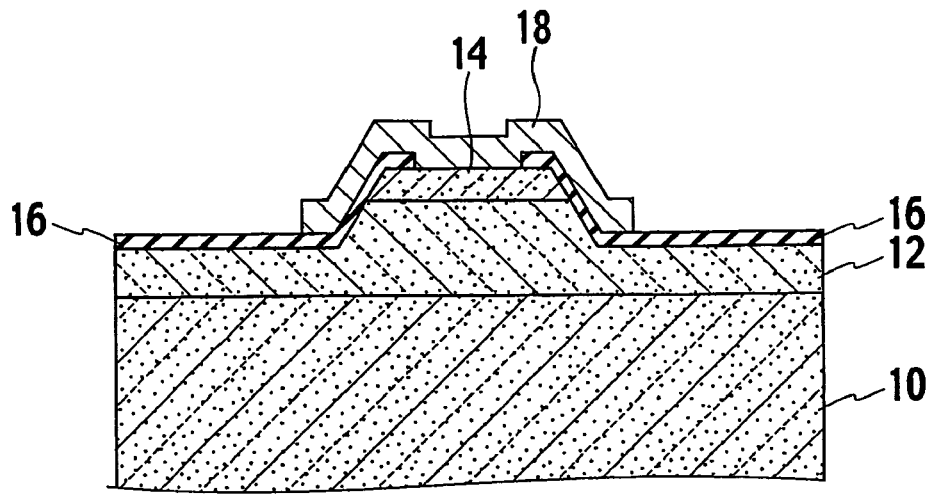

A native oxide film on the front surface of the contact film 14, exposed in the opening of the insulating film 16, is removed by pretreatment using hydrochloric acid (HCl), aqua regia and the like. By electron-beam (EB) evaporation and the like, a Pd film having a thickness of about 10 nm and a Pt film having a thickness of about 50 nm are sequentially deposited on the front surfaces of the contact layer 14 and the insulating film 16. Note that the Pd and Pt films are not limited to the above-mentioned thicknesses. The Pd and Pt films can be deposited in thickness ranges from about 5 nm to about 50 nm and from about 10 nm to about 500 nm, respectively. As shown in FIG. 9, the Pt and Pd films are selectively removed by photolithography, RIE and the like to form the p-side electrode 18. Note that, in order to increase adhesion between the Pd and Pt films, a titanium (Ti) film having a thickness of about 5 nm may be deposited between the Pd and Pt films.

Figure 10:
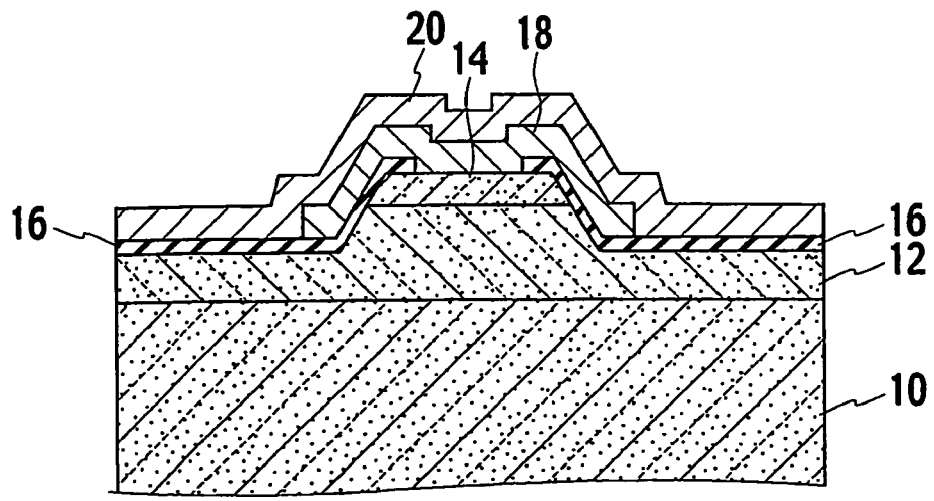

The PdO film in the p-side electrode 18 is oxidized by annealing, similar to that shown in FIG. 2, to form the PdO film. The annealing condition is, for example, a low pressure in an $O_2$ ambience, and a temperature of about 390° C., for about 100 min. As shown in FIG. 10, a metal film for the pad electrode 20, such as Au, is deposited by vacuum deposition, photolithography and the like, so as to cover the p-side electrode 18.

By grinding and the like, a thickness of the substrate 10 is reduced to about 150 μm from a back surface thereof. By vacuum deposition and the like, a metal film for the n-side electrode 22, shown in FIG. 1, is deposited. For the n-side electrode 22, for example, Ti, Pt, and Au films are sequentially deposited with thicknesses of about 100 nm, about 50 nm, and about 500 nm, respectively. After the formation of the n-side electrode 22, an optical resonator is formed by cleaving, to simultaneously separate to a LD chip. Each dielectric multilayer film of a high reflection film and a low reflection film is formed on each pair of facing mirror surfaces of the optical resonator. The LD is manufactured by mounting the chip on a heat sink.

The manufactured LD has an operating voltage of about 3.3 V when a laser beam output power is about 200 mW. The operating voltage of the manufactured LD is lower than the comparative example, since contact resistance of the p-side electrode 18 of the manufactured LD is less than the comparative example. Due to the smaller contact resistance, heat generation at an interface between the p-side electrode 18 and the contact layer 14 may be suppressed. As a result, damage is suppressed in the p-side electrode 18 and the contact layer 14 in the vicinity of the p-side electrode 18. Thus, reliability of the LD may be increased and the operating life is also increased.

For example, reliability of the LD has been examined by an accelerated life test with an environmental temperature of about 80° C. In the accelerated life test, even when a reliability test equivalent to about 100,000 hours has been conducted, no degradation has been observed. Thus, in the LD according to the first embodiment of the present invention, a low operating voltage can be achieved, and reliability may be increased.

In the p-side electrode 18 according to the first embodiment of the present invention, as shown in FIG. 2, the Pt film 34, as a diffusion barrier film, is provided on the Pd film 32. The diffusion barrier film is not limited to a Pt film. Other metal, such as Ni, may be used as the diffusion barrier metal.

Figure 11:
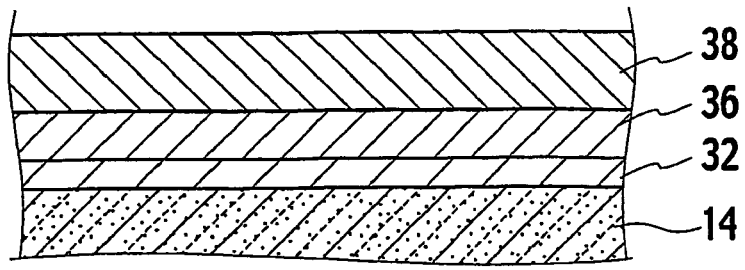
FIGS. 11 to 13 are cross sectional views showing an example of a method for fabricating a p-side electrode according to the first embodiment of the present invention.

For example, as shown in FIG. 11, the Pd film 32, an Ni film 36, and an Au film 38 are sequentially deposited with thicknesses of about 10 nm, about 40 nm, and about 100 nm, respectively, on the p-type GaN contact layer 14 by EB evaporation and the like. Note that thicknesses of the Pd film 32, the Ni film 36, and the Au film 38 are not limited to the above-mentioned thicknesses. The Pd film 32, the Ni film 36, and the Au film 38 can be deposited in thickness ranges of from about 5 nm to about 50 nm, from about 10 nm to about 500 nm, and from about 100 nm to about 800 nm, respectively.

Figure 12:
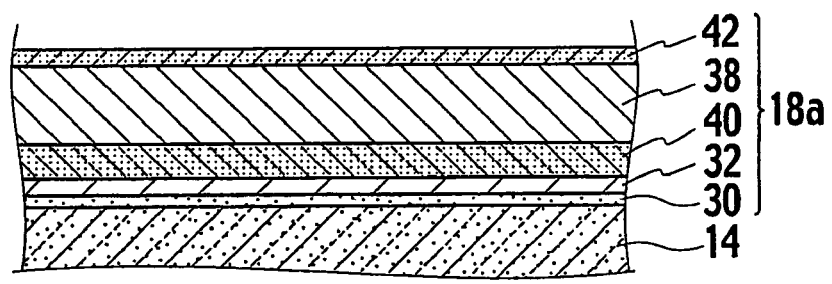

As shown in FIG. 12, a p-side electrode 18a is formed by annealing at a low pressure of about 10 Pa in an $O_2$ ambience, and at a temperature of about 390° C., for about 100 min. Due to the annealing, the Pd film 32 is oxidized so as to form the PdO film 30 on the contact layer 14. During the annealing, the Ni film 36 is also oxidized so as to form a first Ni containing film 40 on the Pd film 32. Additionally, Ni atoms are diffused into the Au film 38 during the annealing to be oxidized on a front surface of the Au film 38. Thus, a second Ni containing film 42 is formed on the Au film 38.

Figure 13:
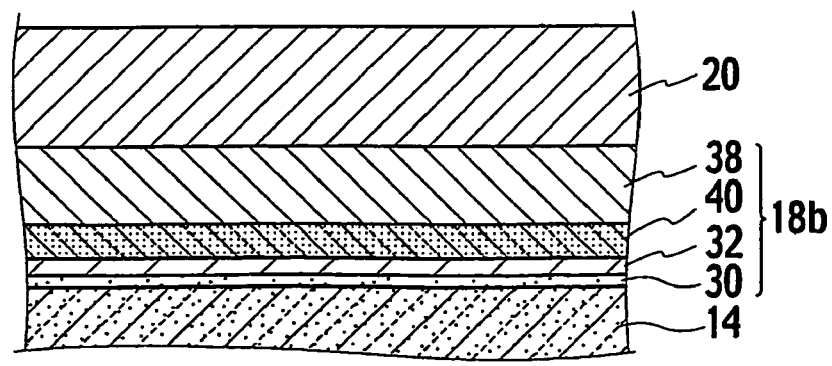

By wet etching using an acid and the like, the second Ni containing film 42 is removed. As shown in FIG. 13, the pad electrode 20 is formed on the Au film 38 in a p-side electrode 18b by evaporation and the like. Note that the pad electrode 20 may be formed on the p-side electrode 18a without removing the second Ni containing film 42.

Figure 14:
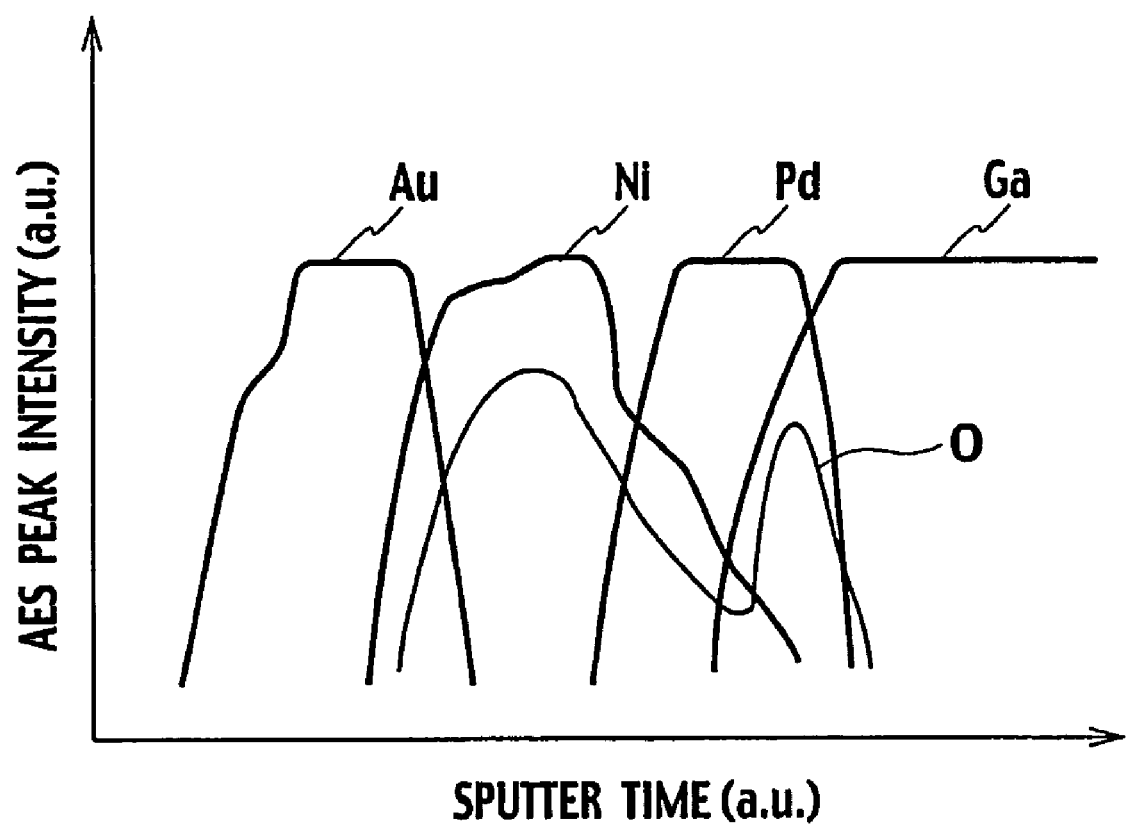
FIG. 14 is a view showing another example of a measurement result of AES of a p-side electrode according to the first embodiment of the present invention.

With respect to the p-side electrode 18b, by AES in combination with sputtering, a distribution of elements as a function of depth has been measured. For example, as shown in FIG. 14, distributions of AES peaks of Au, Ni, Pd, and Ga respectively are sequentially observed from a front surface of the Au film 38. In the Ni film, O is observed. In the interface between the Pd and Ga, O is also observed. During the annealing, the Ni is diffused into the Pd but does not reach the interface with GaN. Thus, the PdO film 30 is formed between the Pd film 32 and the contact layer 14. It has been determined that the thus formed PdO film 30 mainly includes the PtS structure type PdO crystal and has low contact resistance.

Additionally, it can be understood that a Ni metal and a Ni oxide are included in the first Ni containing film 40. The Ni oxide is a semiconductor and has an electrical conductivity. Note that a Ni metal and a Ni oxide are also included in the second Ni containing film 42. It has been determined by AES that the mol fraction of O contained in the first Ni containing film 40 is less than the second Ni containing film 42.

It can be understood that the Ni metal and Ni oxide in the first Ni containing film 40 serve as diffusion barrier films. Therefore, reliability of the LD may be increased.

Second Embodiment

Figure 15:
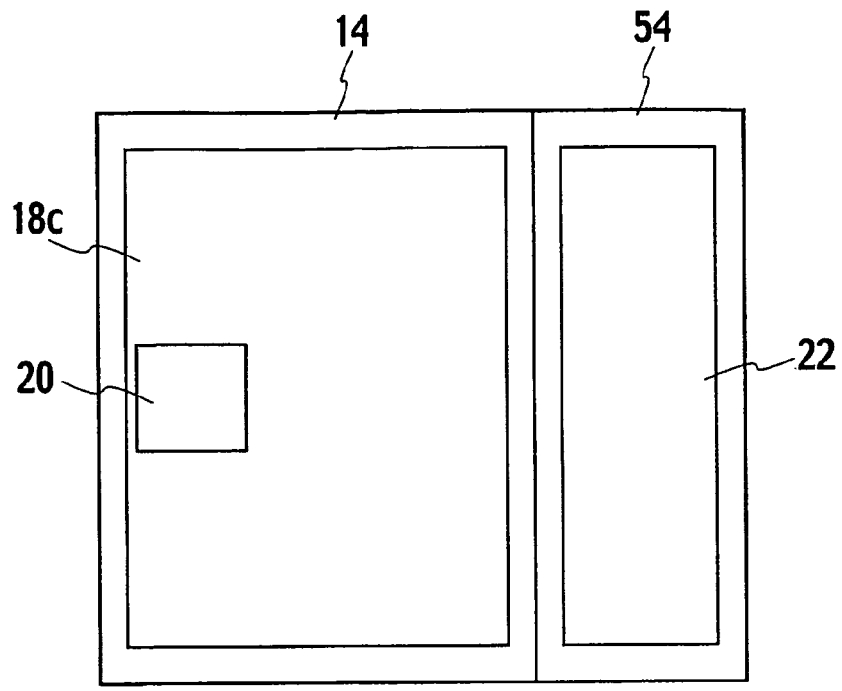
FIG. 15 is a plan view showing an example of a semiconductor device according to a second embodiment of the present invention.

An LED as a semiconductor device according to a second embodiment of the present invention, as shown in FIG. 15, includes a p-side electrode 18c provided on a p-type GaN contact layer 14, and an n-side electrode 22 provided on an n-type GaN contact layer 54. A pad electrode 20 is provided on an opposite side to the n-side electrode 22 in a surface of the p-side electrode 18c.

Figure 16:
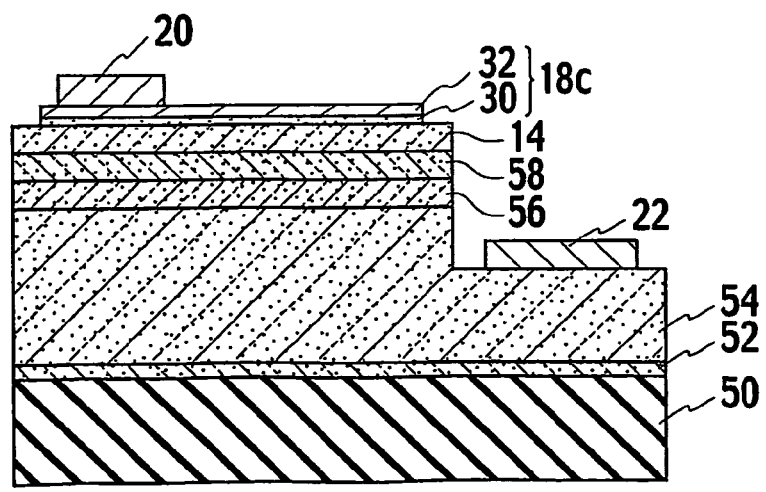
FIG. 16 is a cross sectional view showing an example of the semiconductor device according to the second embodiment of the present invention.

A nitride semiconductor layer of the LED is grown by MOCVD. For example, as shown in FIG. 16, a buffer layer 52 such as AlN, is grown on a front surface of a substrate 50, such as sapphire. The n-type GaN contact layer 54, an n-type InGaN light-emitting layer 56, a p-type AlGaN cap layer 58, and the p-type GaN contact layer 14 are sequentially grown on the buffer layer 52.

A pretreatment using aqua regia or the like is applied to a front surface of the contact layer 14. Afterward, a Pd film 32 is deposited with a thickness of about 50 nm on the front surface of the contact layer 14 by EB evaporation and the like. The Pd film 32 is selectively removed by photolithography, RIE and the like, to form a p-side electrode 18c. Annealing at a low pressure of about 10 Pa in an $O_2$ ambience, and a temperature of about 390° C., for 100 min is performed. During the annealing, the Pd film 32 of the p-side electrode 18c is oxidized so as to form a PdO film 30 in the vicinity of the contact layer 14.

In a region where the Pd film 32 has been selectively removed by photolithography, dry etching and the like, the contact layer 54 is exposed by removing the contact layer 14, the p-type light-emitting layer 58, the n-type light-emitting layer 56, and a part of the contact layer 54. An n-side electrode 22 is formed by sequentially depositing Ti, Pt and Au by photolithography, EB evaporation and the like. In a region where the p-side electrode 18c and the n-side electrode 22 are not formed, a protective insulating film (not illustrated), such as $SiO_2$, $Si_3N_4$, and the like, is formed as appropriate. The pad electrode 20 for connecting a bonding wire is formed on the opposite side to the n-side electrode 22 in the front surface of the p-side electrode 18c.

By dicing and the like, the substrate 50 is separated into about 300 μm square LED chips. The LED chip is mounted on a heat sink by a silver (Ag) paste and the like. The LED is manufactured by connecting bonding wires, such as Au wires, to the pad electrode 20 and the n-side electrode 22, respectively.

Electric current is injected through the bonding wires into the manufactured LED. The injected current is about 20 mA, with an operating voltage of about 2.9 V. When the injected current is increased to about 200 mA, it has been confirmed that the operating voltage is bout 3.5 V and that the LED stably operates. Thus, in the LED according to the second embodiment of the present invention, a low operating voltage can be achieved, and reliability may be increased.

Other Embodiments

In the first and second embodiments of the present invention, applications to a p-side electrode of a nitride semiconductor light-emitting element have been described. However, as a p-side electrode, a PdO film can be applied, not only to a nitride semiconductor, but also to a semiconductor such as zinc selenide (ZnSe), zinc oxide (ZnO), silicon carbide (SiC), and diamond (C), which has a wide band gap. Additionally, a PdO film according to the present invention can be used, not only for a light-emitting device, but also as an ohmic electrode for a carrier traveling-type device such as a field effect transistor (FET). In such case also, an operating voltage can be decreased and reliability may be increased.

The entire contents of Japanese Patent Application P2005-172585 filed on Jun. 13, 2005 are incorporated by reference herein.

Various modifications will become possible for those skilled in the art after storing the teachings of the present disclosure without departing from the scope thereof.

The invention claimed is:

1. A semiconductor device, comprising:
    a p-type nitride semiconductor layer; and
    a p-side electrode including a palladium oxide film connected to a surface of the p-type nitride semiconductor layer, the palladium oxide film includes a platinum sulfide structure type palladium oxide crystal;
    wherein a percentage content of the platinum sulfide structure type palladium oxide crystal included in the palladium oxide film is not less than about 50%.

2. The semiconductor device of claim 1, wherein the p-side electrode includes a palladium film on a surface of the palladium oxide film.

3. The semiconductor device of claim 2, wherein the p-side electrode includes a first nickel containing film, made partly of a nickel oxide, on a surface of the palladium film, and a gold film on a surface of the first nickel containing film.

4. The semiconductor device of claim 3, wherein the p-side electrode includes a second nickel containing film, made partly of a nickel oxide, on the gold film.

5. The semiconductor device of claim 4, wherein mol fraction of oxygen contained in the first nickel containing film is less than the mol fraction in the second nickel containing film.

6. The semiconductor device of claim 1, wherein the p-side electrode includes a platinum film on the palladium oxide film.

* * * * *

UNITED STATES PATENT AND TRADEMARK OFFICE
CERTIFICATE OF CORRECTION

PATENT NO.         : 7,592,641 B2
APPLICATION NO.    : 10/574850
DATED              : September 22, 2009
INVENTOR(S)        : Saito et al.

Page 1 of 1

It is certified that error appears in the above-identified patent and that said Letters Patent is hereby corrected as shown below:

On the title page, Item (86), should read:

-- (86)  PCT No.:    PCT/JP2006/303523

§ 371 (c)(1),
(2), (4) Date:   Apr. 6, 2006 --

Signed and Sealed this

Tenth Day of November, 2009

David J. Kappos
*Director of the United States Patent and Trademark Office*